United States Patent [19]
Nukui

[11] Patent Number: 5,497,077
[45] Date of Patent: Mar. 5, 1996

[54] POWER CALCULATING DEVICE

[75] Inventor: Tadashi Nukui, Kanagawa, Japan

[73] Assignee: Kabushiki Kaisha Toshiba, Kawasaki, Japan

[21] Appl. No.: 278,311

[22] Filed: Jul. 21, 1994

[30] Foreign Application Priority Data

Jul. 21, 1993 [JP] Japan ..................... 5-179501

[51] Int. Cl.[6] .................................................. G01R 33/00
[52] U.S. Cl. .................... 324/117 H; 324/130; 324/141; 324/142; 324/251
[58] Field of Search ............................... 324/117 H, 130, 324/141, 142, 251; 364/847

[56] References Cited

U.S. PATENT DOCUMENTS 4,742,296  5/1988  Petr et al. ............................... 324/142
5,065,088  11/1991  Habiro et al. ......................... 324/117 H Primary Examiner—Kenneth A. Wieder
Assistant Examiner—Kourosh Cyrus Khosravi
Attorney, Agent, or Firm—Oblon, Spivak, McClelland, Maier & Neustadt

[57] ABSTRACT

A power calculating device including a control signal generating unit for generating a control signal. The control signal determines a power calculating period and an imbalance compensation period. The device also includes an input voltage changeover unit for changing over between a first voltage corresponding to a voltage of a system under measurement and a constant voltage under the control of the control signal to generate a second voltage, which is the first voltage during the power calculating period and the constant voltage during the imbalance compensation period. The device further includes a Hall element member for generating a third voltage corresponding to a product of the second voltage and a magnetic density generated by a magnetic field applied to the Hall element member. The device also includes an imbalance detecting unit for generating an offset compensation signal based on the third voltage, and a variable resistor connected to the Hall element member. The resistance value thereof is changed by the offset compensation signal, whereby an imbalance voltage of the Hall element member is compensated.

13 Claims, 9 Drawing Sheets

POWER CALCULATING DEVICE

BACKGROUND OF THE INVENTION

1. Field of the Invention

This invention relates to a power calculating device using a Hall element, and in particular relates to a power calculating device wherein imbalance voltage of the Hall element is automatically compensated.

2. Description of the Related Art

Power calculating devices of this kind are widely employed for wattmeters and for watthour meters on account of their simple construction and because the device lends itself to miniaturization.

Such a prior art power calculating device will now be described with reference to FIG. 7. The voltage of the system that is the subject of measurement, applied across terminals P1, P2, is input through a voltage converter 1 consisting of a voltage divider including resistors R1 and R2 or a transformer circuit to a voltage-current converter 2, where it is converted to a current A with the magnitude directly proportional to the input voltage. This current is applied to current terminals T1, T2 of a Hall element 3 as the control current of Hall element 3. Hall element 3 is equipped with output terminals T3, T4 arranged at right angles with respect to current terminals T1, T2. A magnetic field B is applied as shown in FIG. 7 in the direction at right angles to the direction of current terminals T1, T2 and to the direction of output terminals T3, T4 by means of a magnetic core 20 shown in FIG. 9. A Hall voltage $V_H$ of magnitude given by equation (1) directly proportional to the product of the magnetic flux density generated by the magnetic field and the control current flowing between current terminals T1 and T2 is generated across output terminals T3, T4 of Hall element 3.

$$V_H = R \cdot B \cdot J \quad (1)$$

where R is the Hall coefficient, B is the magnetic flux density, and J is the current density of the control current. A subtractor 4 is constructed with an operational amplifier OP1, and resistors R3, R4, R5 and R6. Subtractor 4 outputs a voltage proportional to the product of the control current and magnetic flux density by removing the in-phase component of Hall voltage $V_H$ generated across output terminals T3, T4. This voltage is inverted in polarity by inverting amplifier 5 as a voltage C, which is output outside as an output of power calculating device. FIG. 8 is a time-chart showing the operating waveform of various units of this power calculating device.

However, as the perfect symmetry of the output characteristic of Hall element 3 is not guaranteed, an offset voltage is generated due to an imbalance component D shown in FIG. 8. So that, there was the problem that the detection accuracy in output voltage C of the prior art power calculating device described above was lowered as shown in FIG. 8.

SUMMARY OF THE INVENTION

Accordingly, one object of this invention is to provide a power calculating device in which imbalance components due to temperature change and secular change etc. can be automatically compensated. Another object of this invention is to provide a power calculating device in which the power value can be calculated with high accuracy.

These and other objects of this invention is achieved by providing a power calculating device including a control signal generating unit for generating a control signal. The control signal determines a power calculating period and an imbalance compensation period. The power calculating device also includes an input voltage changeover unit connected to receive a first voltage corresponding to a voltage of a system under measurement and the control signal for changing over between the first voltage and a constant voltage under the control of the control signal to generate a second voltage. The second voltage is the first voltage during the power calculating period and the constant voltage during the imbalance compensation period. The device further includes a Hall element member connected to receive a current corresponding to the second voltage for flowing the current in the Hall element member between current terminals thereof to generate a third voltage corresponding to a product of the second voltage and a magnetic density generated by a magnetic field applied to the Hall element member. The device also includes an imbalance detecting unit connected to receive the control signal and the third voltage for detecting an offset of the Hall element member based on the third voltage when the control signal shows the imbalance compensation period to generate an offset compensation signal corresponding to the offset. The device further includes a variable resistor connected to the Hall element member and connected to receive the offset compensation signal. The resistance value thereof is changed by the offset compensation signal. The device also includes a power value outputting unit connected to receive the third voltage and the control signal for outputting the third voltage when the control signal shows the power calculating period as an output of the power calculating device corresponding to a power of the system under measurement, whereby an imbalance voltage of the Hall element member is compensated.

In this invention, the offset voltage of the Hall element can be detected by the imbalance detecting unit from the signal calculating by the output voltage of the Hall element when a constant voltage is applied which is input synchronously with the voltage of the system under measurement, so the imbalance voltage can be compensated by applying this voltage to a variable resistor element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
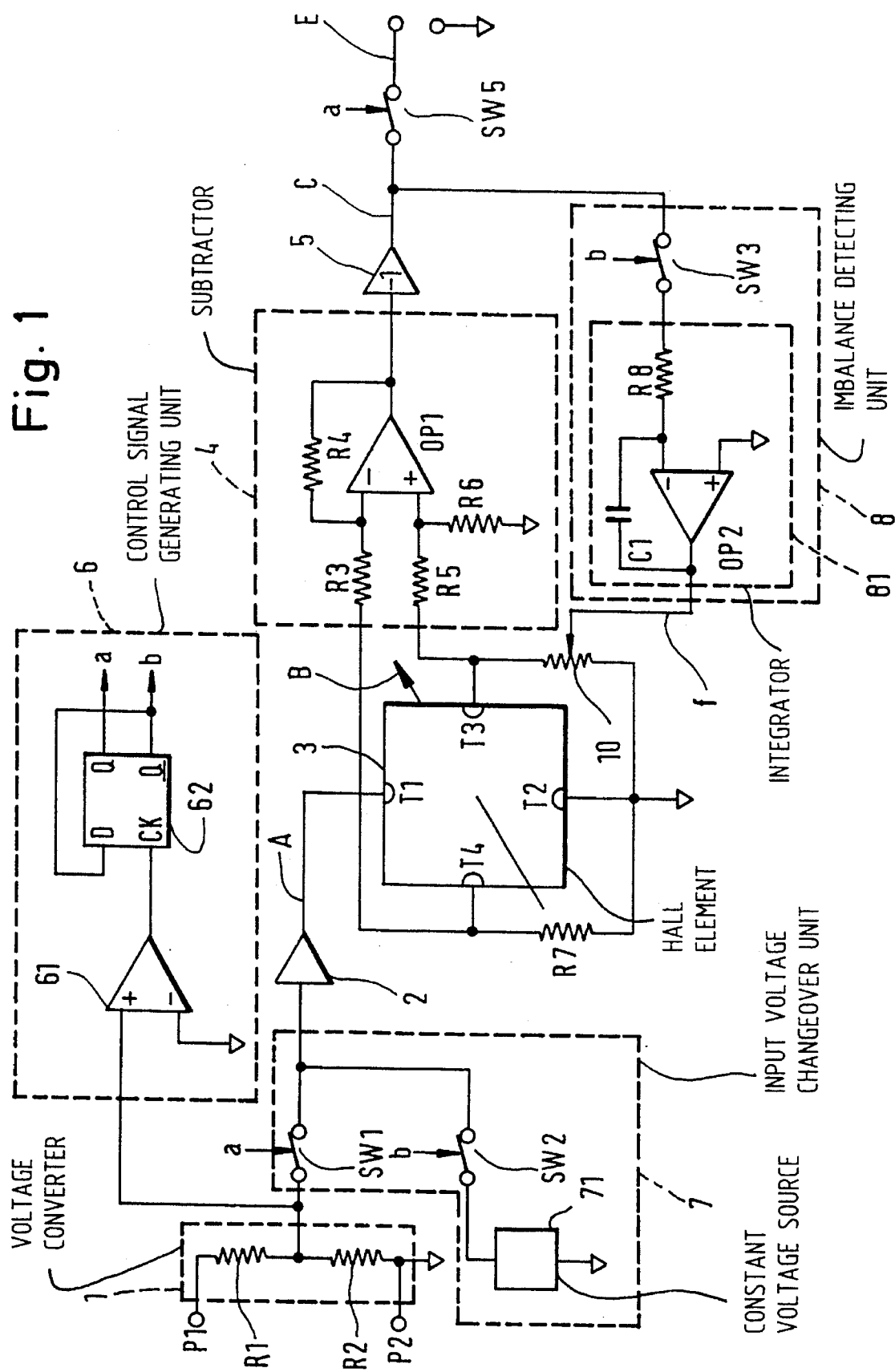
FIG. 1 is a circuit diagram showing a power calculating device according to an embodiment of this invention.
Figure 9:
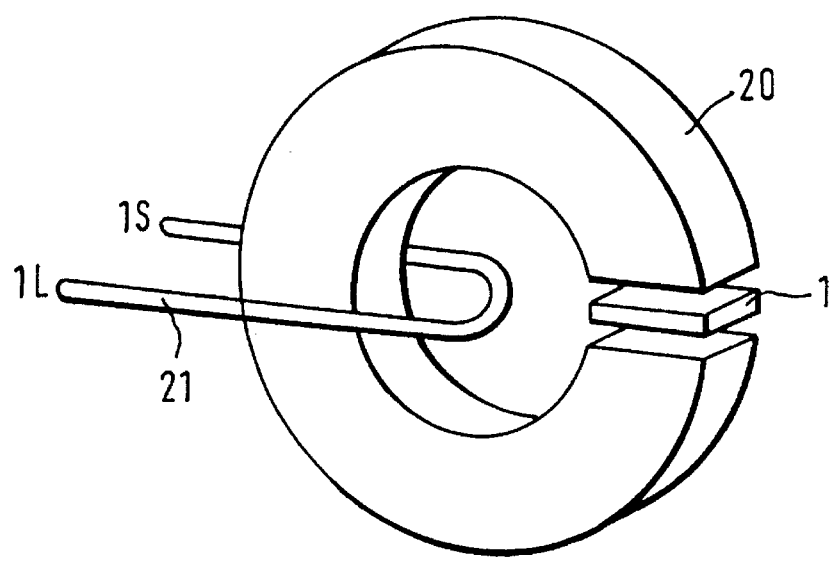
FIG. 9 is a constructional diagram given in explanation of a Hall element positional in the gap of a magnetic core.

Referring now to the drawings, wherein like reference numerals designate identical or corresponding parts throughout the several views, the embodiments of this invention will be described below. FIG. 1 is a circuit diagram of a power calculating device according to an embodiment of this invention. In this Figure, P1 and P2 are power source voltage input terminals which input the power source voltage of the system under measurement. 1 is voltage converter for stepping down or stepping up the power source voltage of the system under measurement which is input to input terminals P1 and P2. Voltage converter 1 can be implemented using a voltage divider constructed of resistors R1 and R2 as shown in this Figure, or a transformer etc. 2 is voltage-current converter which receives an output voltage of an input voltage changeover unit 7 described later, and outputs a current A proportional to the input voltage thereof. 3 is Hall element provided with current terminals T1, T2 which input current A outputted from voltage-current converter 2, and with output terminals T3, T4 which output the voltage obtained by the Hall effect. Furthermore, Hall element 3 is positioned as shown in FIG. 9, in the gap of core 20 of magnetic material, on which is wound a current coil 21, such that the plane defined by current terminals T1, T2 and output terminals T3, T4 is maintained at right angles to the magnetic field generated in the gap. In FIG. 9, 1S and 1L are current input terminals of current coil 21, for inputting the current under measurement. This current is converted to the magnetic field B proportional to the current and is applied to Hall element 3. 4 is subtractor which outputs the difference of the AC voltages which are output across output terminals T3, T4 of Hall element 3. 5 is inverting amplifier which inverts the polarity of the output voltage of subtractor 4 to produce voltage C. Voltage C is connected to switched SW5 to generate a voltage E as the output of this power calculating device. 6 is a control signal generating unit that generates control signals in synchronism with the voltage of the system under measurement. It is constructed of a comparator 61 which compares the output voltage of voltage converter 1 with a reference potential and a D flip-flop 62 which is driven by the output of comparator 61. 7 is input voltage changeover unit constructed of switches SW1 and SW2 and a constant voltage source 71. Input voltage changeover unit 7 generates an output which is complementarily changed over, under the control of the control signals from control signal generating unit 6, between the voltage of the system under measurement and a constant voltage which is maintained at a constant value by a constant voltage source 71. 8 is an imbalance detecting unit and is constructed of an integrator 81 and a switch SW3, and detects the offset of Hall element 3 by inputting from subtractor 4 through inverting amplifier 5 a signal which is outputted by Hall element 3, when constant voltage is applied to voltage-current converter 2 by input voltage changeover unit 7. Integrator 81 is constructed with a resistor R8, a capacitor C1 and an operational amplifier OP2. 10 is a variable resistor element constructed with an FET or a CdS photocoupler or the like, which receives as control input an output signal f from imbalance detecting unit 8, and is used so as to eliminate the offset by compensating the imbalance component of Hall element 3. R7 is a resistor connected between output terminal T4 and ground, and is provided with the aim of ensuring that the range of the compensation of the imbalance component to be performed by variable resistor element 10 keep to be positive.

Furthermore, a switch SW5 is provided, which inputs voltage C and outputs a voltage E outside by opening and closing switch SW5 as an output of the power calculating device.

Figure 2:
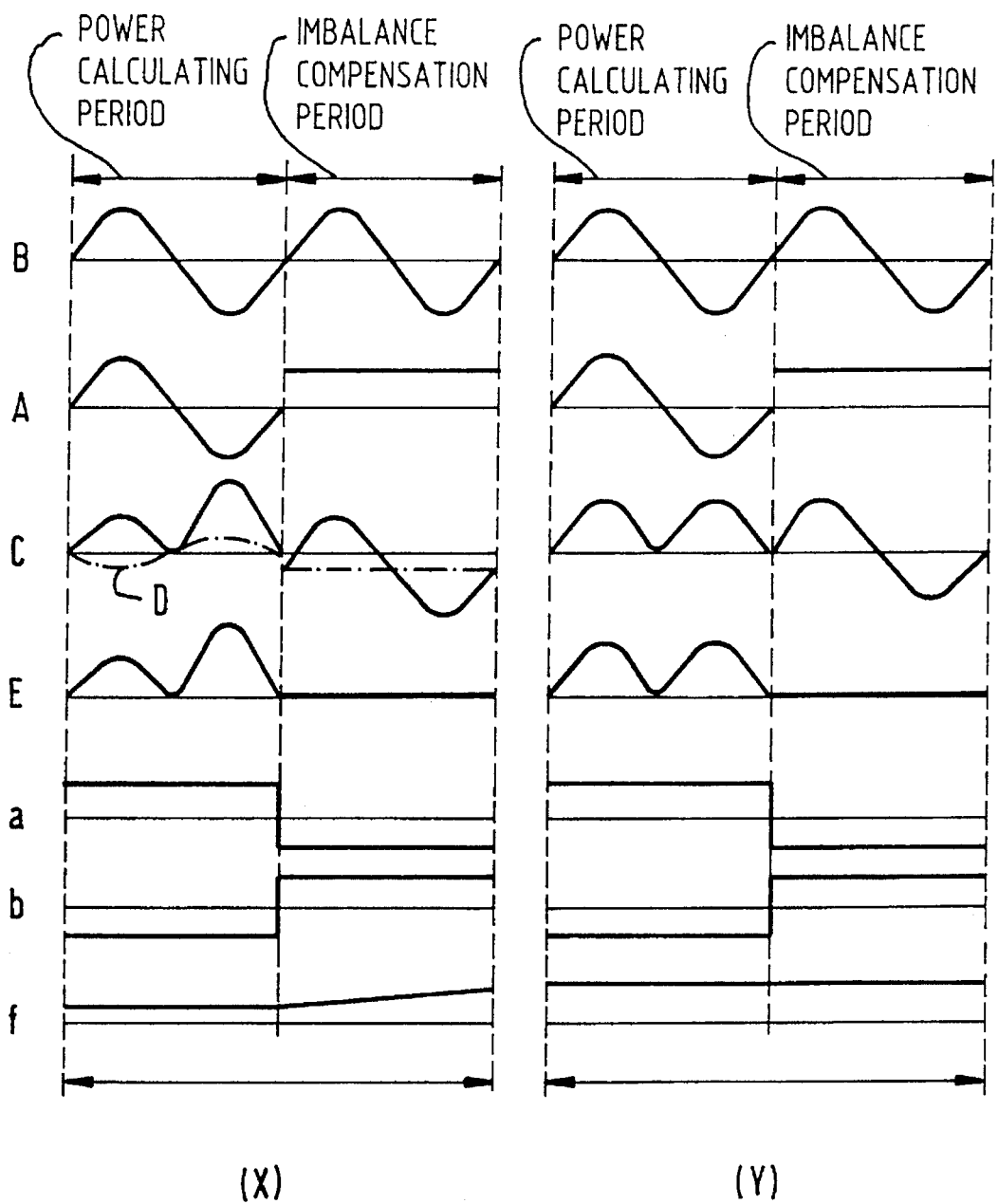
FIG. 2 is a time-chart showing the operating waveform of the various units of the power calculating device shown in FIG. 1.

Next, the operation of the device constructed as above will be described with reference to the circuit diagram of FIG. 1 and to FIG. 2, which shows a time-chart of the waveforms of each unit. In FIG. 2, (X) and (Y) show the waveforms before and after the imbalance component is compensated, respectively. The power source voltage of the system under measurement which is input to power source voltage input terminals P1 and P2 is converted to a suitable voltage by voltage converter 1. The suitable voltage is then input to control signal generating unit 6 and input voltage changeover unit 7. Comparator 61 of control signal generating unit 6 compares the output voltage of voltage converter 1 with the reference potential. If the output voltage of voltage converter 1 is higher than this reference potential, comparator 61 outputs a high-level voltage. if it is lower, comparator 61 outputs a low-level voltage. D flip-flop 62 receives the output of comparator 61 as its input, and inverts its output state in response to high-level input. Hereinbelow, the Q output a and the Q output b of D flip-flop 62 will be respectively called a control signal a and a control signal b. Control signal a is applied to switches awl and SW5, and control signal b is applied to switches SW2 and SW3. The period for which control signal a is high-level will be called the power calculating period and the period for which control signal b is high-level will be called the imbalance compensation period. Input voltage changeover unit 7 inputs control signal a and control signal b from control signal generating unit 6. During the power calculating period when switch SW1 is closed by control signal a, it supplies the output voltage of voltage converter 1 to voltage-current converter 2. During the imbalance compensation period when switch SW2 is closed by control signal b, it supplies the constant voltage of constant voltage source 71 to voltage-current converter 2. Consequently, in the power calculating period, the result of the calculation performed by Hall element 3, which is output through subtractor 4 and inverting amplifier 5, is a voltage which is proportional to the product of control current proportional to the voltage of the system under measurement and the magnetic flux proportional to the current of the system under measurement. In the imbalance compensation period, the result of this calculation which is thus output is a voltage which is proportional to the product of the constant voltage of constant voltage source 71 and the current of the system under measurement. If an imbalance component is present in Hall element 3, the waveform of output voltage C of inverting amplifier 5 becomes asymmetric as shown in FIG. 2 (X) due to the imaginary output waveform D as shown in FIG. 2 (X) produced by the imbalance component. In the imbalance compensation period, on receipt of control signal b from control signal generating unit 6, imbalance detecting unit 8 closes switch SW3, with the result that output waveform C of inverting amplifier 5 in the imbalance compensation period is integrated by integrator 81. This integration by integrator 81 of the offset voltage due to the imbalance component gives rise to voltage f as shown in FIG. 2 (X). Application of this voltage f to variable resistor element 10 changes its resistance value thus enabling the imbalance component of Hall element 3 to be compensated. By appropriate setting of the value of the resistance of variable resistor element 10, waveforms of the various units as shown in FIG. 2 (Y) are obtained when the imbalance component is compensated. Switch SW5 is provided such that only the power due to the voltage of the system under measurement is output, by closing switch SW5 during the period of power calculation and opening switch SW5 in the period of imbalance compensation. As is clear from FIG. 2 (Y), especially from the waveforms of voltages C and E, it is found that the imbalance component D is well compensated in this embodiment.

As an alternative to switch SW5, a sample-hold unit may be employed which samples the output of inverting amplifier 5 in the power calculating period and holds this sampled voltage during the imbalance compensation period.

In this embodiment the power calculating period and imbalance compensation period were set to the same time width. However, they could be set in any desired ratio, for example, making the imbalance compensation period once for every 10 times of the power calculating period.

Thus, the construction of the embodiment described above enables a power calculating device of high accuracy to be obtained, since the imbalance component of Hall element 3 can be compensated by detecting the offset value of Hall element 3 and changing the resistance of variable resistor element 10 in response to this offset value.

Figure 3:
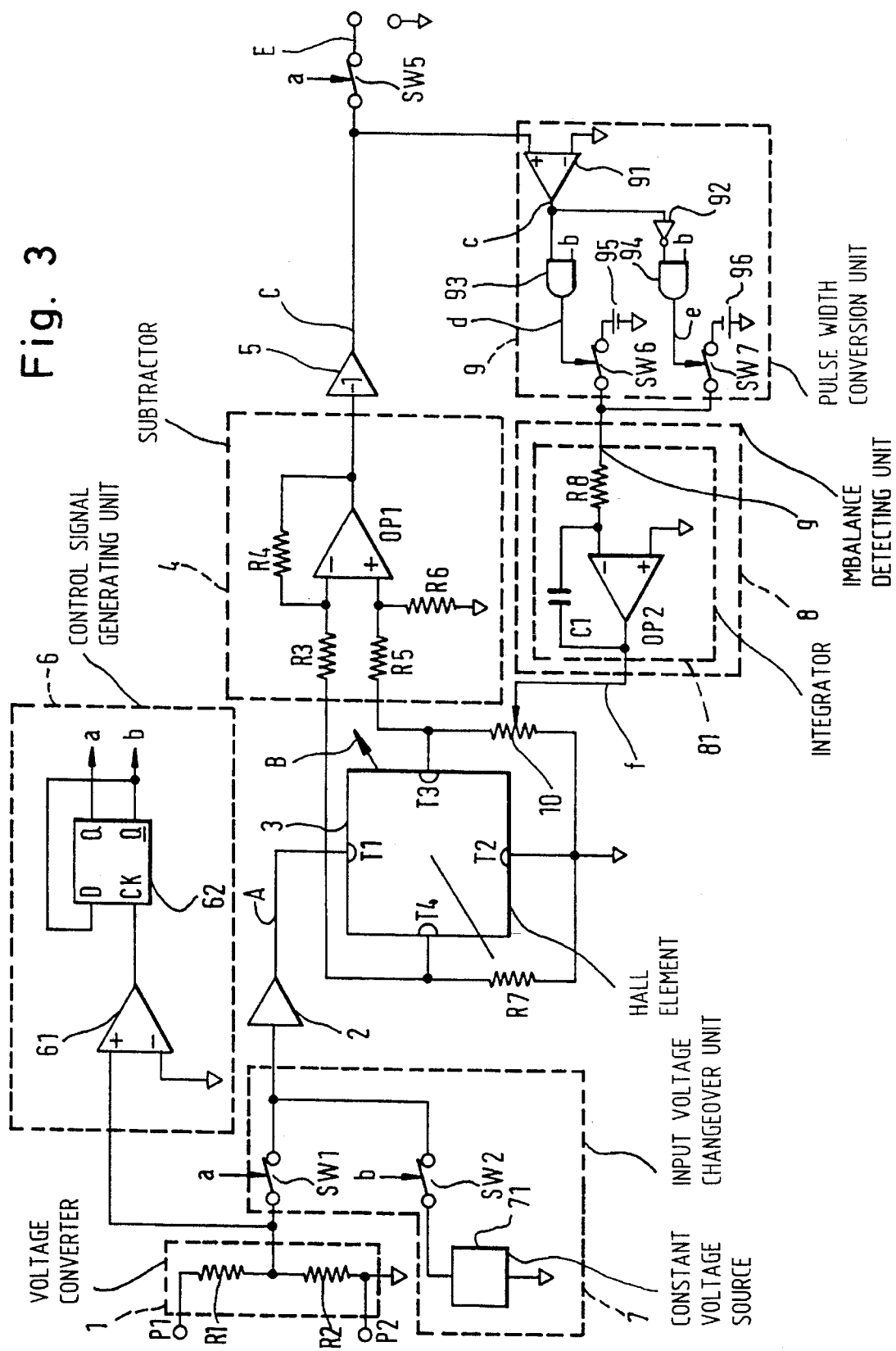
FIG. 3 is a circuit diagram showing a power calculating device according to another embodiment of this invention.
Figure 4:
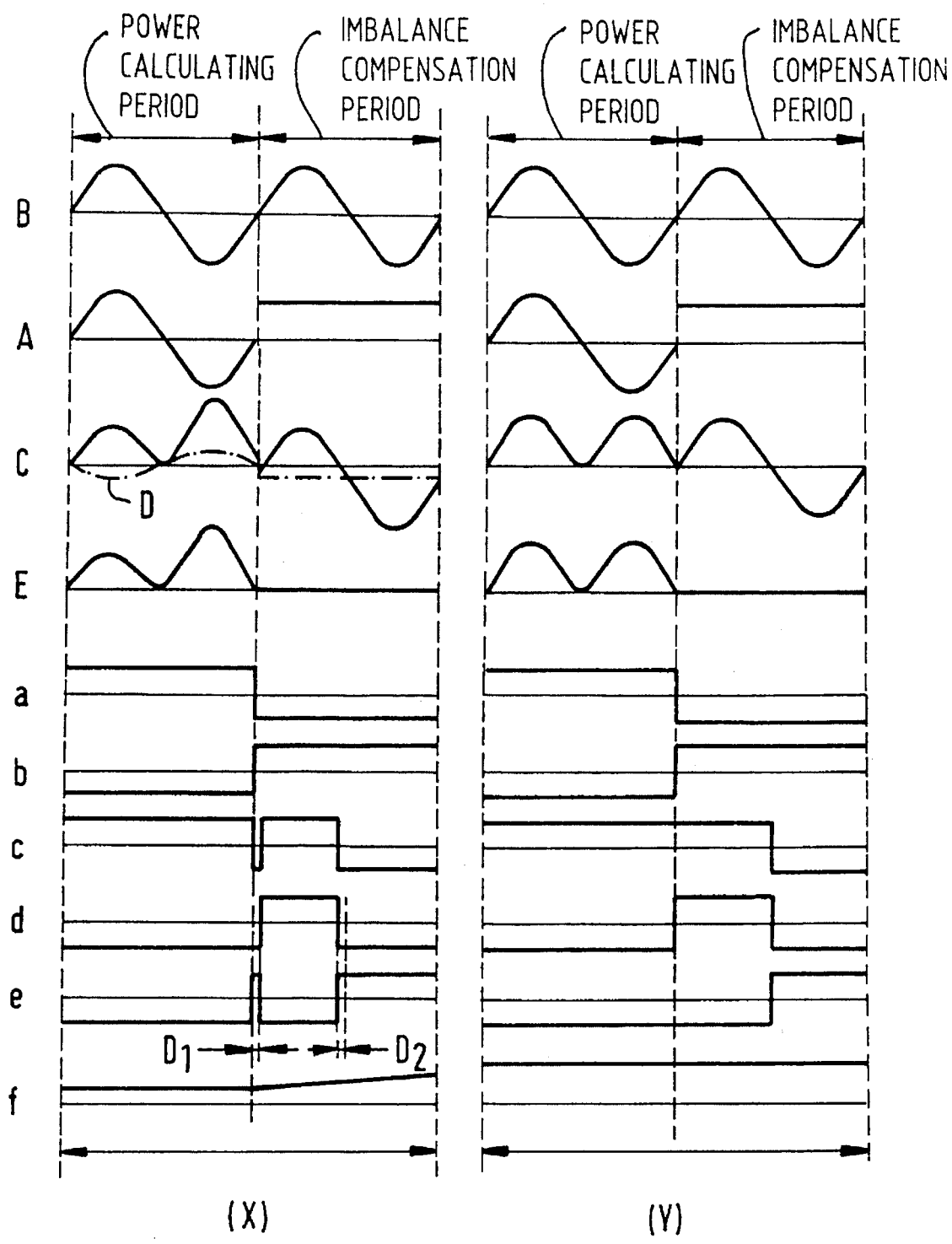
FIG. 4 is a time-chart showing the operating waveform of the various units of the power calculating device shown in FIG. 3.

FIG. 3 shows a power calculating device according to another embodiment of this invention. FIG. 4 shows a time-chart of the waveforms of each unit in FIG. 3. In FIG. 4, (X) and (Y) show the waveforms before and after the imbalance component is compensated, respectively. In this embodiment, the compensation voltage of the imbalance component is obtained by converting the offset value produced by the imbalance component in the output of inverting amplifier 5 into a pulse width by means of a pulse width conversion unit 9. A comparator 91 in pulse width conversion unit 9 compares output voltage C of inverting amplifier 5 with a reference potential, and outputs a voltage c of a high-level voltage when output voltage C of inverting amplifier 5 is higher than the reference potential but voltage c of a low-level voltage when it is lower than the reference potential. The output signal waveform c of comparator 91 is shown in FIG. 4. Output signal c of comparator 91 is input to one input terminal of an AND gate 93 and, through an inverter 92, to one input terminal of an AND gate 94. Furthermore, control signal b is input to another terminals of AND gates 93 and 94, respectively. Output signals d and e of AND gates 93 and 94 are applied to switches SW6 and SW7, respectively. Thus only during the imbalance compensation period, switches SW6 and SW7 are closed when signals d and e are high-level, respectively, allowing constant voltages of a positive constant voltage source 95 and a negative constant voltage source 96 to be supplied as a voltage g to imbalance detecting unit 8, respectively. Positive constant voltage source 95 and negative constant voltage source 96 output positive and negative voltages which are equal but of opposite sign, respectively, Thus, in the period for which output voltage C of inverting amplifier 5 is higher than the reference potential (period in which the waveform of signal d is high-level in FIG. 4(X)), a positive voltage is input to integrator 81 of imbalance detecting unit 8. And in the period for which it is lower than the reference potential (period in which the waveform of signal e is high-level in FIG. 4(X)), a negative voltage of equal absolute value is input thereto. Therefore, in one imbalance compensation period, the negative voltage is input longer than the positive voltage is input by the time of pulse widths D1 and D2. This means that the offset due to the imbalance component is converted to the pulse widths D1 and D2. Integrator 81 therefore outputs voltage f proportional to the offset due to the imbalance component of Hall element 3, as shown in FIG. 4(X). Thus the same effect as in the embodiment of FIG. 1 can be achieved, since the imbalance component of Hall element 3 can be compensated by applying voltage f to variable resistor element 10, changing its resistance value.

Figure 4A:
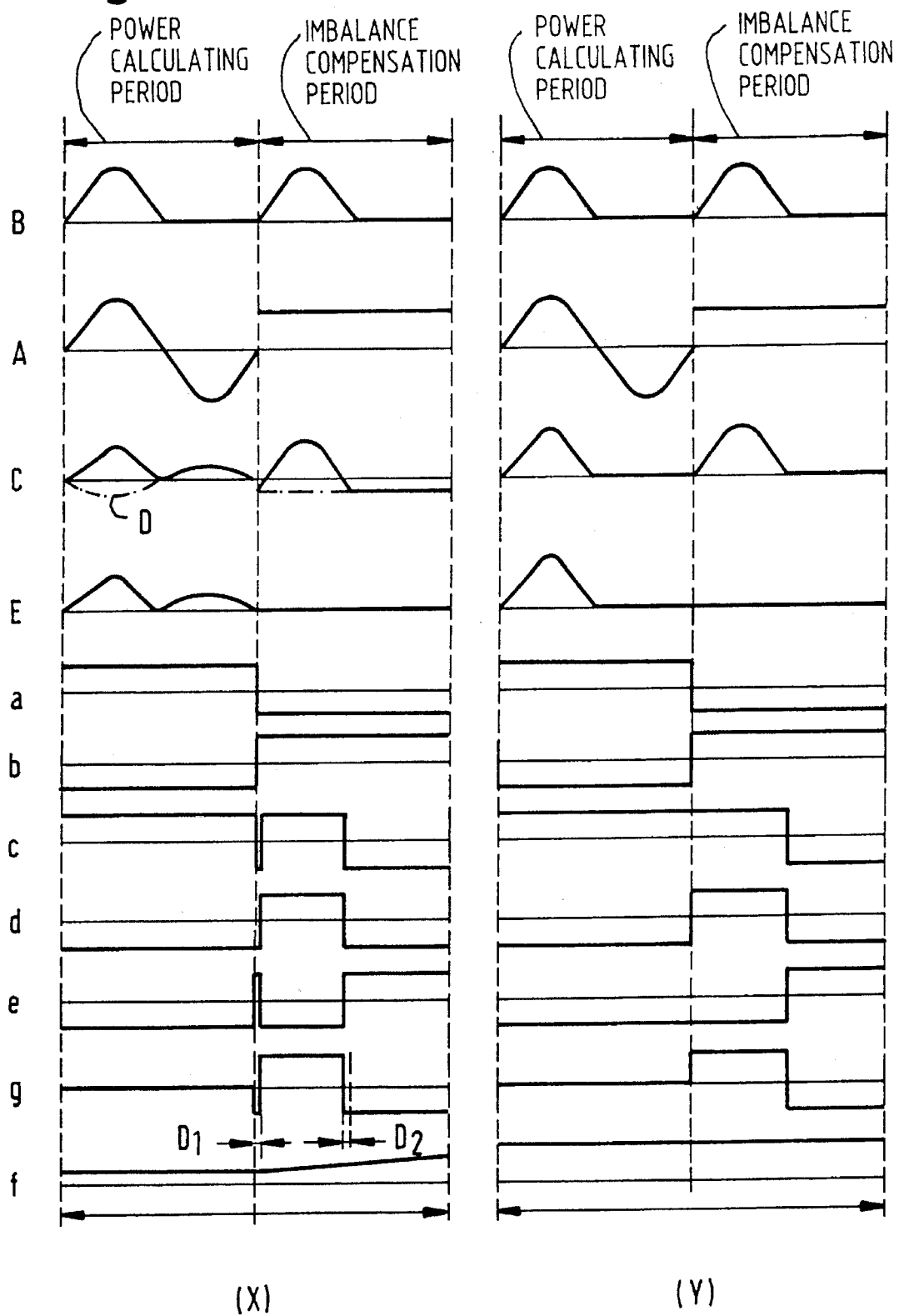
FIG. 4A is a time-chart showing another operating waveform of the various units of the power calculating device shown in FIG. 3.

This embodiment shown in FIG. 3 is well applied to the case where the current under measurement is asymmetric, FIG. 4A shows a time-chart of the waveforms of each unit in FIG. 3 in this case, wherein the waveform of magnetic flux B proportional to the current under measurement is asymmetric. In FIG. 4A, (X) and (Y) show the waveforms before and after the imbalance component is compensated, respectively.

In this case comparator 91 compares output voltage C, shown in FIG. 4A, of inverting amplifier 5 with the reference potential, and outputs a voltage c of a high-level voltage when output voltage C is higher than the reference potential but voltage c of a low-level voltage when it is lower than the reference potential. The waveform of voltage c is shown in FIG. 4A. The following operation of the power calculating device in this case is the same as that in the case where the current under measurement is symmetric.

Accordingly, when the current under measurement is asymmetric as shown in signal B of FIG. 4A, the compensation voltage f for the imbalance component of Hall element 3 can be obtained by converting the offset value produced by the imbalance component in the output of inverting amplifier 5 into pulse widths D1 and D2 by means of a pulse width conversion unit 9.

Figure 5:
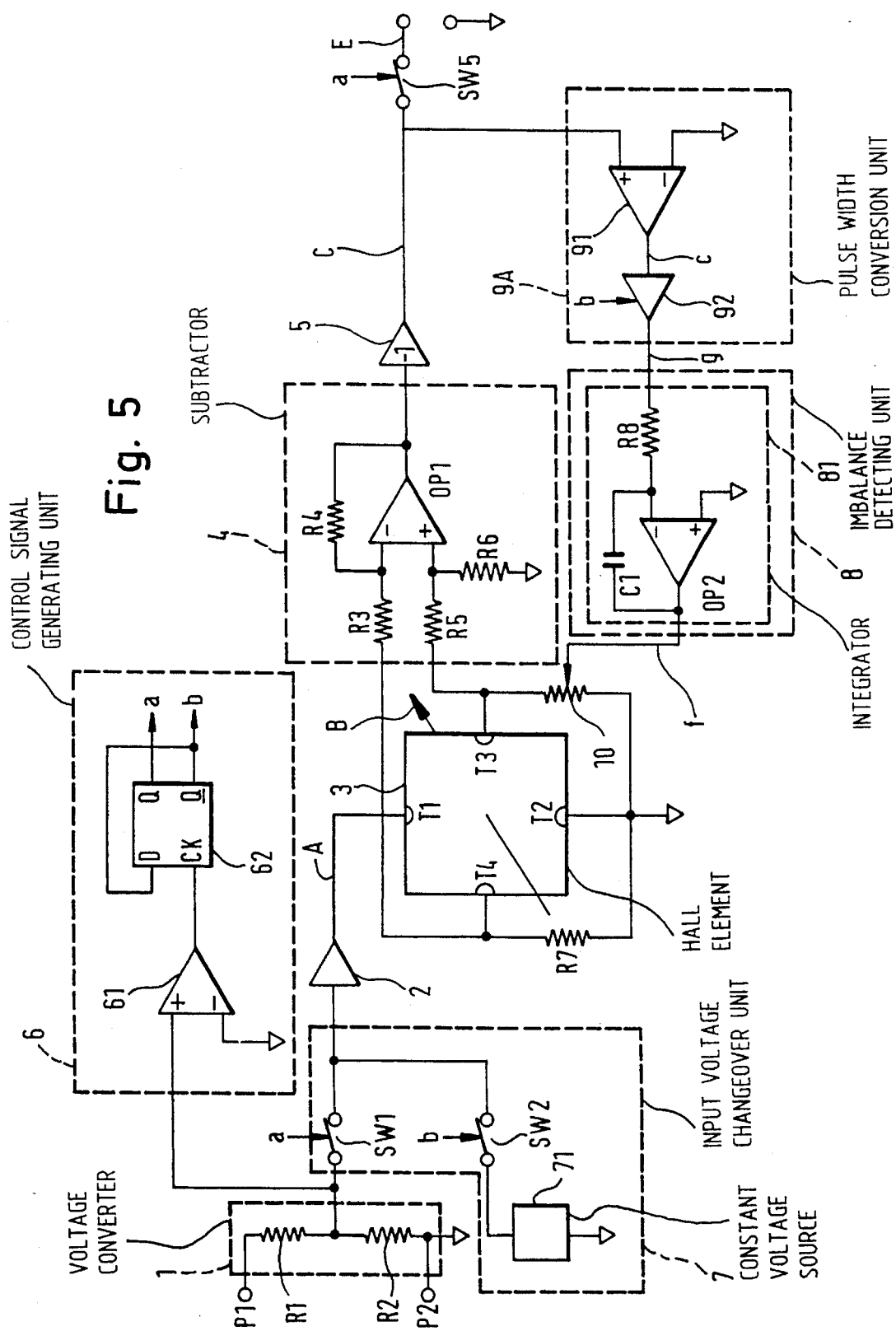
FIG. 5 is a circuit diagram showing a power calculating device according to still another embodiment of this invention.

FIG. 5 shows a power calculating device according to still another embodiment of this invention. Pulse width conversion unit 9 in FIG. 3 is substituted by a pulse width conversion unit 9A in this embodiment. Pulse width conversion unit 9A is constructed with comparator 91 and a three-state buffer 92, for example MC 14503B made by MOTOROLA Inc.. Output voltage c of comparator 91 and control signal b from control signal generating unit 6 are applied to three-state buffer 92. As a result, three-state buffer 92 outputs a voltage g, which is applied to imbalance detecting unit 8 instead of voltage g in FIG. 3.

Figure 6:
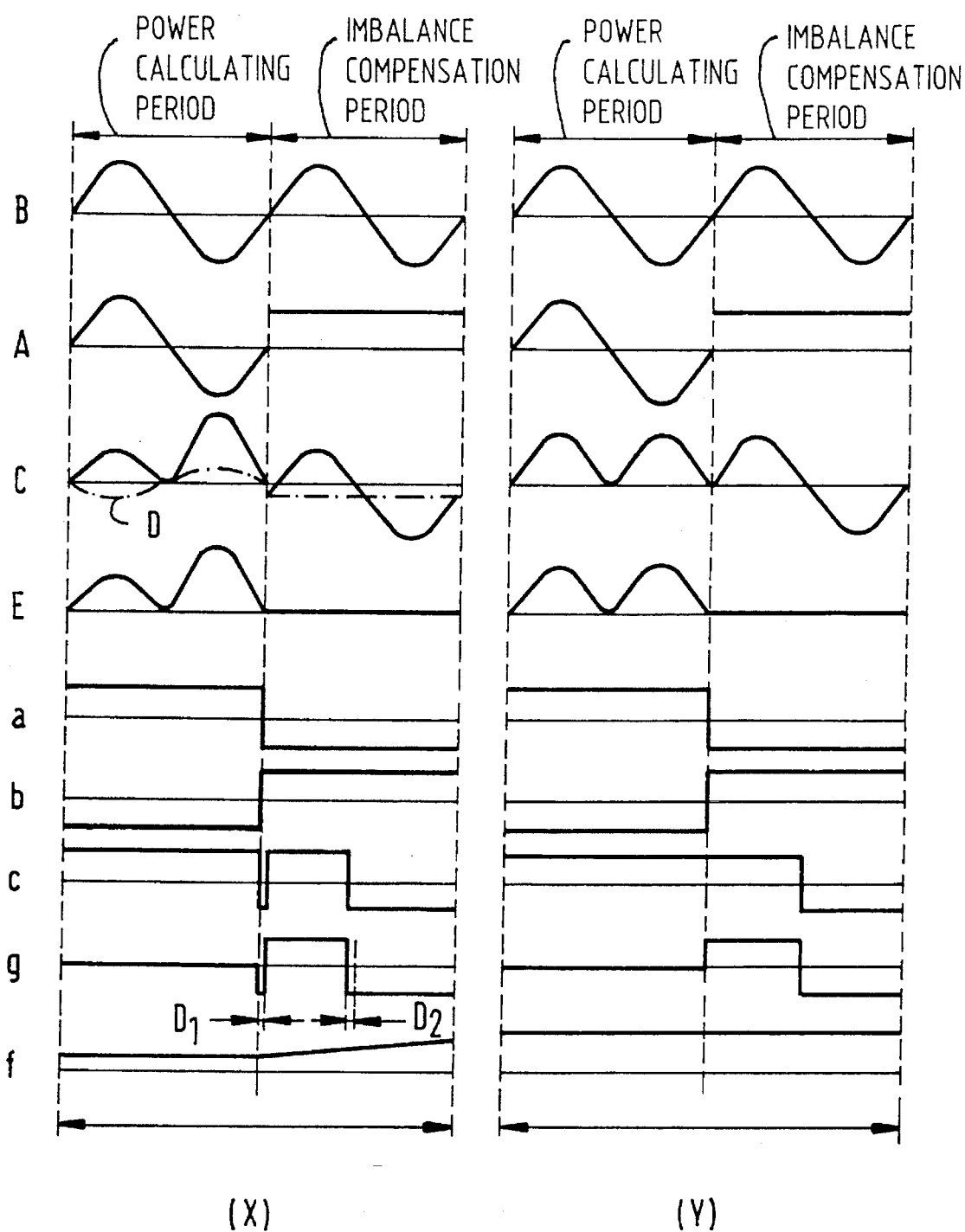
FIG. 6 is a time-chart showing the operating waveform of the various units of the power calculating device shown in FIG. 5.
Figure 7:
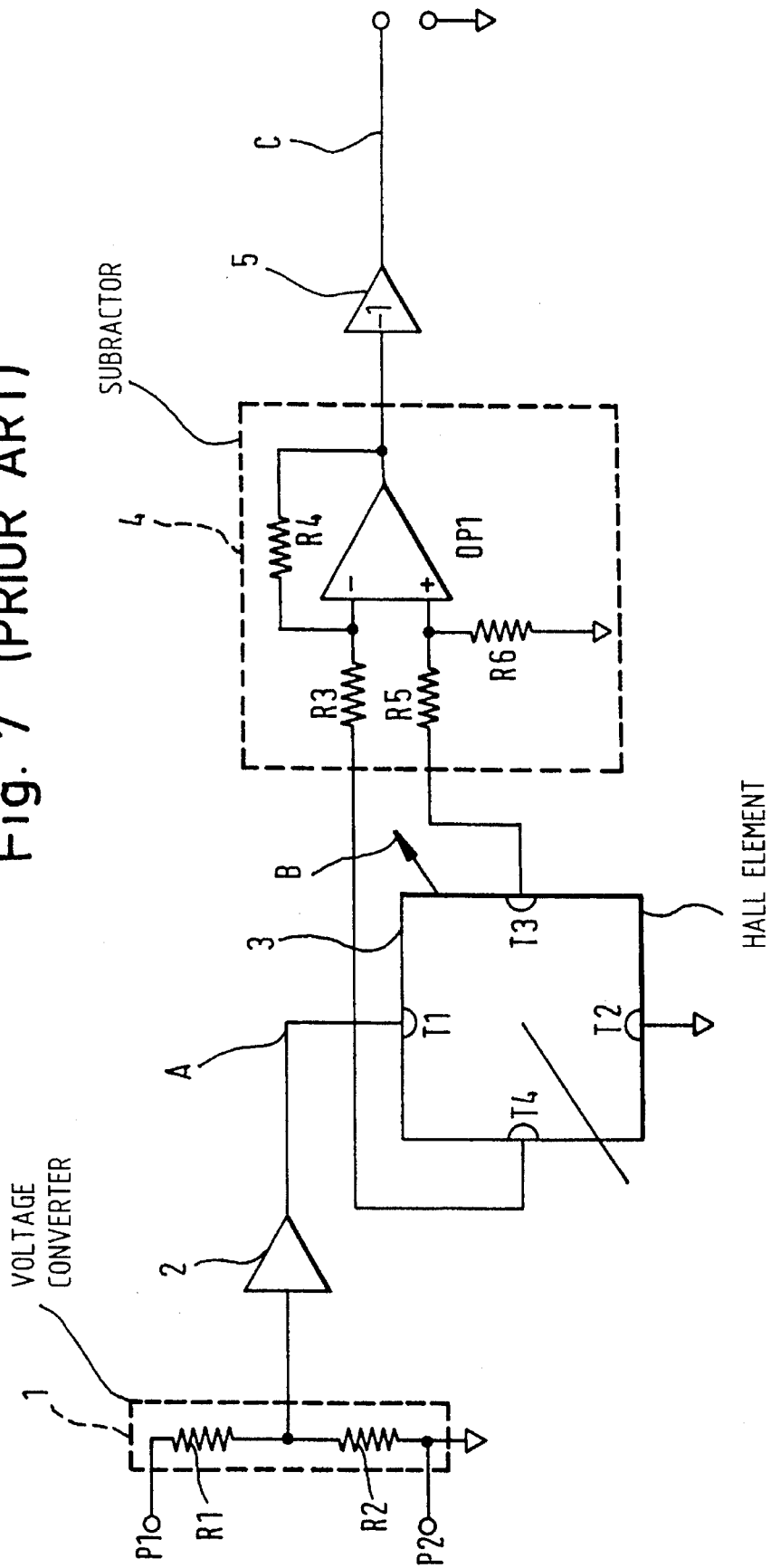
FIG. 7 is a circuit diagram showing a prior art power calculating device.
Figure 8:
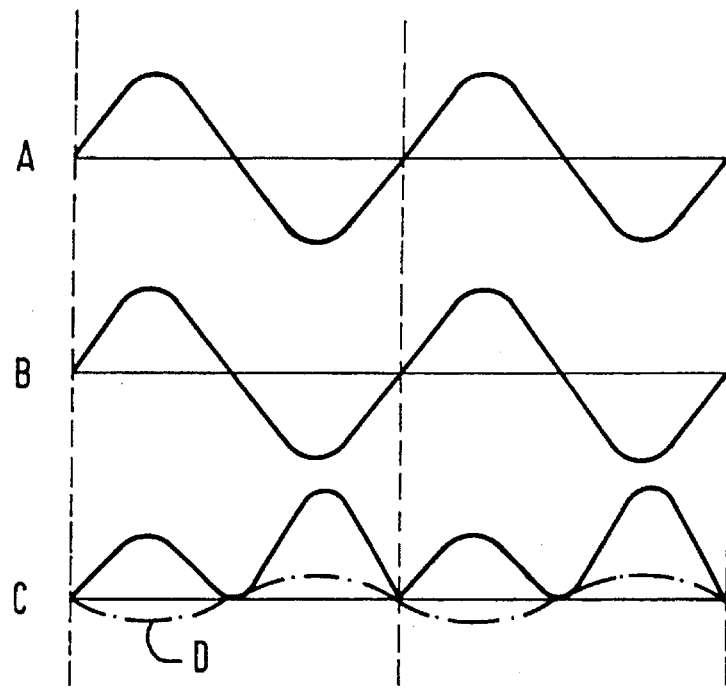
FIG. 8 is a diagram given in explanation of the offset produced by the imbalance component of the Hall element of the prior art power calculating device shown in FIG. 8.

FIG. 6 shows a time-chart of the waveforms of each unit in FIG. 5. In FIG. 6, (X) and {Y) show the waveforms before and after the imbalance component is compensated, respectively.

As is clear from FIG. 6, especially the waveforms of voltages g, C and E, in this embodiment, the same effect as in the case of embodiment of FIG. 3 can be obtained by a simple construction.

In the above-described embodiments, variable resistor element 10 is connected between output terminal T3 of Hall element 3 and the ground. But this invention is not limited to these embodiments. Variable resistor element 10 may be connected between output terminal T3 and one of current terminals T1 and T2 of Hall element 3, instead.

As described above, with this invention, a power calculation device of high accuracy which can automatically compensate the imbalance component of the Hall element, including temperature changes and secular changes etc, can easily be obtained even if the current waveform of the system under measurement,is asymmetric. This enables its applications to be expanded in many directions.

Obviously, numerous modifications and variations of the present invention are possible in light of the above teachings. It is therefore to be understood that within the scope of the appended claims, the invention may be practiced otherwise than as specifically described herein.

What is claimed is:

1. A power calculating device, comprising:

control signal generating means for generating a control signal determining a power calculating period and an imbalance compensation period;

input voltage changeover means which receives a first voltage corresponding to a voltage of a system under measurement and said control signal for changing over between said first voltage and a constant voltage under the control of said control signal to generate a second voltage;

said second voltage being said first voltage during said power calculating period and said constant voltage during said imbalance compensation period;

a Hall element member which receives a current corresponding to said second voltage for flowing said current in said Hall element member between current terminals thereof to generate a third voltage corresponding to a product of said second voltage and a magnetic density generated by a magnetic field applied to said Hall element member;

imbalance detecting means which receives said control signal and said third voltage for detecting an offset of said Hall element member based on said third voltage when said control signal shows said imbalance compensation period to generate an offset compensation signal corresponding to said offset;

variable resistor means connected to said Hall element member and which receives said offset compensation signal, a resistance value thereof being changed by said offset compensation signal; and power value outputting means which receives said third voltage and said control signal for outputting said third voltage when said control signal shows said power calculating period as an output of said power calculating device corresponding to a power of said system under measurement;

whereby an imbalance voltage of said Hall element member being compensated.

2. The power calculating device according to claim 1: wherein said variable resistor means includes one of a Field Effect Transistor and a cadmium sulfide photocoupler.

3. The power calculating device according to claim 1: wherein said control signal generating means receives said first voltage for generating said control signal in synchronism with said first voltage.

4. The power calculating device according to claim 1: wherein in said input voltage changeover means, said changing over between said first voltage and said constant voltage is performed so that the power calculating period equals the imbalance compensation period.

5. The power calculating device according to claim 1, wherein said control signal generating means includes:

a comparator which receives said first voltage for comparing said first voltage and a reference potential to generate a comparison output signal based on a comparison result;

a D flip-flop which receives said comparison output signal for generating said control signal based on said comparison output signal; and said control signal including a first control signal for determining said power calculating period and a second control signal for determining said imbalance compensation period.

6. The power calculating device according to claim 1, wherein said input voltage changeover means includes:

a constant voltage source for generating said constant voltage;

a first switch which receives said first control signal and said first voltage for generating said first voltage as said second voltage during said power calculating period determined by said first control signal; and a second switch which receives said second control signal and said constant voltage for generating said constant voltage as said second voltage during said imbalance compensation period determined by said second control signal.

7. The power calculating device according to claim 1, wherein:

said power value outputting means includes a fifth switch which receives said first control signal and said third voltage for outputting said third voltage as said output of said power calculating device during said power calculating period determined by said first control signal.

8. The power calculating device according to claim 1, wherein said imbalance detecting means includes:

a third switch which receives said second control signal and said third voltage for outputting said third voltage during said imbalance compensation period determined by said second control signal; and an integrator for integrating an output signal of said third switch duping said imbalance compensation period to generate said offset compensation signal.

9. The power calculating device according to claim 1, wherein said imbalance detecting means includes:

a pulse width conversion unit which receives said second control signal and said third voltage for detecting said offset of said Hall element member based on said third voltage during said imbalance compensation period determined by said second control signal to generate a pulse signal with a pulse width;

said pulse width of said pulse signal corresponding to said offset of said Hall element member; and an integrator for integrating said pulse signal outputted from said pulse width conversion unit during said imbalance compensation period to generate said offset compensation signal.

10. The power calculating device according to claim 9, wherein said pulse width conversion unit includes:

a comparator which receives said third voltage for comparing said third voltage with a reference potential to generate a comparison output signal based on said comparison result;

a first AND gate which receives said comparison output signal and said second control signal for generating a first AND output signal;

an inverter for inverting said comparison output signal to generate an inverted comparison output signal;

a second AND gate which receives said inverted comparison output signal and said second control signal for generating a second AND output signal;

a positive constant voltage source for generating a positive constant voltage;

a negative constant voltage source for generating a negative constant voltage;

a sixth switch which receives said first AND output signal and said positive constant voltage for outputting said positive constant voltage as said pulse signal during when said first AND output signal shows a prescribed value; and a seventh switch which receives said second AND output signal and said negative constant voltage for outputting said negative constant voltage as said pulse signal during when said second AND output signal shows said prescribed value.

11. The power calculating device according to claim 9, wherein said pulse width conversion unit includes:

a comparator which receives said third voltage for comparing said third voltage with a reference potential to generate a comparison output signal based on said comparison result; and a three-state buffer which receives said comparison output signal and said second control signal for generating said pulse signal with said pulse width corresponding to said offset of said Hall element member.

12. The power calculating device according to claim 1:

wherein said Hall element member receives said magnetic field caused by a current under measurement which is asymmetric.

13. The power calculating device according to claim 1:

wherein said variable resistor means is connected between an output terminal of said Hall element member and one of the ground and said current terminals.

\* \* \* \* \*